United States Patent
Li et al.

(10) Patent No.: US 12,306,270 B2
(45) Date of Patent: May 20, 2025

(54) ELECTRICAL FAULT DETECTION AND INTERRUPTION DEVICE AND RELATED ELECTRICAL CONNECTORS AND ELECTRICAL APPLIANCES

(71) Applicant: Chengli Li, Suzhou (CN)

(72) Inventors: Chengli Li, Suzhou (CN); Long Chen, Suzhou (CN); Guolan Yue, Suzhou (CN)

(73) Assignee: Chengli Li, Suzhou (CN)

( * ) Notice: Subject to any disclaimer, the term of this patent is extended or adjusted under 35 U.S.C. 154(b) by 176 days.

(21) Appl. No.: 18/450,000

(22) Filed: Aug. 15, 2023

(65) Prior Publication Data
US 2024/0426941 A1    Dec. 26, 2024

(30) Foreign Application Priority Data

Jun. 21, 2023 (CN) .......................... 202310744054.8
Jun. 21, 2023 (CN) .......................... 202321595081.5

(51) Int. Cl.
*G01R 31/52* (2020.01)
*G08B 21/18* (2006.01)

(52) U.S. Cl.
CPC .......... *G01R 31/52* (2020.01); *G08B 21/185* (2013.01)

(58) Field of Classification Search
USPC .......................................................... 324/509
See application file for complete search history.

(56) References Cited

U.S. PATENT DOCUMENTS

2004/0057870 A1* 3/2004 Isaksson ............ G01N 21/6452
436/164

* cited by examiner

*Primary Examiner* — Farhana A Hoque
(74) *Attorney, Agent, or Firm* — Chen Yoshimura LLP

(57) ABSTRACT

An electrical fault detection and interruption device includes a switch module coupled between input and output ends of current carrying lines, a GFCI (ground fault circuit interrupter) fault detection module for generating a ground fault signal when detecting a leakage current on the current carrying lines, an AFCI (arc fault circuit interrupter) fault detection module for generating an arc fault signal when detecting harmful arcs on the current carrying lines, a drive module for driving the switch module to disconnect the electrical connection between the input and output ends in response to the ground fault signal and/or arc fault signal, a fault signal transfer module for generate a simulated leakage current signal in response to the arc fault signal, and a monitoring module for generating a harmful arc signal to test whether the electrical fault detection and interruption device is functioning normally.

18 Claims, 7 Drawing Sheets

ELECTRICAL FAULT DETECTION AND INTERRUPTION DEVICE AND RELATED ELECTRICAL CONNECTORS AND ELECTRICAL APPLIANCES

BACKGROUND OF THE INVENTION

This invention relates to electrical circuits, and in particular, it relates to an electrical fault detection and protection device that integrates GFCI and AFCI functions, and related electrical connectors and electrical appliances.

With increased safety awareness, consumers often install both ground fault circuit interrupter devices (GFCI) and arc fault circuit interrupter devices (AFCI) in their homes. GFCI protects against electrical shock, while AFCI protects against electrical fire caused by aging electrical components. It is sometimes inconvenient to install both devices.

SUMMARY OF THE INVENTION

To solve the above problems, the present invention is directed to an electrical fault detection and interruption device which integrates both GFCI and AFCI functions, and can also detect malfunction in both. This offers more convenience to users.

In one aspect, the present invention provides an electrical fault detection and interruption device, which includes: a plurality of current carrying lines having an input end and an output end; a switch module, coupled on the current carrying lines between the input end and the output end, configured to connect or disconnect an electrical connection between the input end and the output end; a GFCI (ground fault circuit interrupter) fault detection module, configured to generate a ground fault signal in response to a leakage current on the current carrying lines; an AFCI (arc fault circuit interrupter) fault detection module, configured to generate an arc fault signal in response to harmful arcs on the current carrying lines; a drive module, configured to, in response to the ground fault signal and/or the arc fault signal, drive the switch module to disconnect the electrical connection between the input end and the output end; a fault signal transfer module, configured to generate a first simulated leakage current signal in response to the arc fault signal; and a monitoring module, configured to generate a harmful arc signal, to test whether the electrical fault detection and interruption device is functioning normally.

In some embodiments, the GFCI fault detection module includes: a leakage current signal processing module, configured to detect the leakage current on the current carrying lines, and to generate the ground fault signal in response to the leakage current exceeding a predetermined threshold; and a self-test module, configured to periodically generate a second simulated leakage current, to test whether the leakage current signal processing module is functioning normally.

In some embodiments, the AFCI fault detection module includes: an arc signal processing module, configured to detect arc signals on the current carrying line, and to generate the arc fault signal in response to detecting harmful arcs on the current carrying line; and a window gate module, coupled to the arc signal processing module, configured to cooperate with the arc signal processing module to determine whether harmful arcs are present on the current carrying line.

In some embodiments, the window gate module is configured to output a window gate signal, and the arc signal processing module is configured to detect arc signals on the current carrying line based on the window gate signal.

In some embodiments, the electrical fault detection and interruption device further includes an alarm module, configured to generate a corresponding alarm signal in response to the ground fault signal and/or the arc fault signal.

In some embodiments, the electrical fault detection and interruption device further includes an auxiliary switch, configured to clear the alarm signal of the alarm module when the switch module is reset.

In some embodiments, the monitoring module is configured to generate the simulated harmful arc signal to detect whether the arc signal processing module is functioning normally; and the fault signal transfer module is configured to, in response to the arc fault signal, generate a simulated leakage current to detect whether the leakage current signal processing module is functioning normally.

In a second aspect, the present invention provides an electrical fault detection and interruption device, which includes: a plurality of current carrying lines having an input end and an output end; a switch module, coupled on the current carrying lines between the input end and the output end, configured to connect or disconnect an electrical connection between the input end and the output end; a GFCI (ground fault circuit interrupter) fault detection module, configured to generate a ground fault signal in response to a leakage current on the current carrying lines; an AFCI (arc fault circuit interrupter) fault detection module, configured to generate an arc fault signal in response to harmful arcs on the current carrying lines; a drive module, configured to, in response to the ground fault signal and/or the arc fault signal, drive the switch module to disconnect the electrical connection between the input end and the output end; a fault signal transfer module, configured to generate a simulated harmful arc signal in response to the ground fault signal; and a monitoring module, configured to generate a first simulated leakage current signal, to test whether the electrical fault detection and interruption device is functioning normally.

In some embodiments, the GFCI fault detection module includes: a leakage current signal processing module, configured to detect the leakage current on the current carrying lines, and to generate the ground fault signal in response to the leakage current exceeding a predetermined threshold; and a self-test module, configured to periodically generate a second simulated leakage current, to test whether the leakage current signal processing module is functioning normally.

In some embodiments, the AFCI fault detection module includes: an arc signal processing module, configured to detect arc signals on the current carrying line, and to generate the arc fault signal in response to detecting harmful arcs on the current carrying line; and a window gate module, coupled to the arc signal processing module, configured to cooperate with the arc signal processing module to determine whether harmful arcs are present on the current carrying line.

In some embodiments, the window gate module is configured to output a window gate signal, and the arc signal processing module is configured to detect arc signals on the current carrying line based on the window gate signal.

In some embodiments, the electrical fault detection and interruption device further includes an alarm module, configured to generate a corresponding alarm signal in response to the ground fault signal and/or the arc fault signal.

In some embodiments, the electrical fault detection and interruption device further includes an auxiliary switch, configured to clear the alarm signal of the alarm module when the switch module is reset.

In some embodiments, the monitoring module is configured to generate the first simulated leakage current to detect whether the leakage current signal processing module is functioning normally; and the fault signal transfer module is configured to, in response to the ground fault signal, generate a simulated harmful arc signal to detect whether the arc signal processing module is functioning normally.

In a third aspect, the present invention provides an electrical power connection device, which includes: a body; and an electrical fault detection and interruption device according to any of the above embodiments, disposed inside the body.

In a fourth aspect, the present invention provides an electrical appliance, which includes: an electrical load; and an electrical power connection device coupled between a power supply and the electrical load, configured to supply power to the electrical load, wherein the electrical power connection device includes an electrical fault detection and interruption device according to any of the above embodiment.

In embodiments of the present invention, the electrical fault detection and interruption device integrates both GFCI function and AFCI function, providing convenience in installation and use for the users. Moreover, by employing the fault signal transfer module, the user can simultaneously test whether the GFCI and the AFCI functions are normal, making the operation convenient for the user.

BRIEF DESCRIPTION OF DRAWINGS

Preferred embodiments of the present invention are described with reference to the drawings. These drawings explain the embodiments and their operating principle, and only illustrate structures that are necessary to the understanding of the invention. These drawings are not to scale. In the drawings, like features are designated by like reference symbols. In the block diagrams, lines between blocks represent electrical or magnetic coupling of the blocks; the absence of lines between blocks does not mean the lack of coupling.

Figure 1:
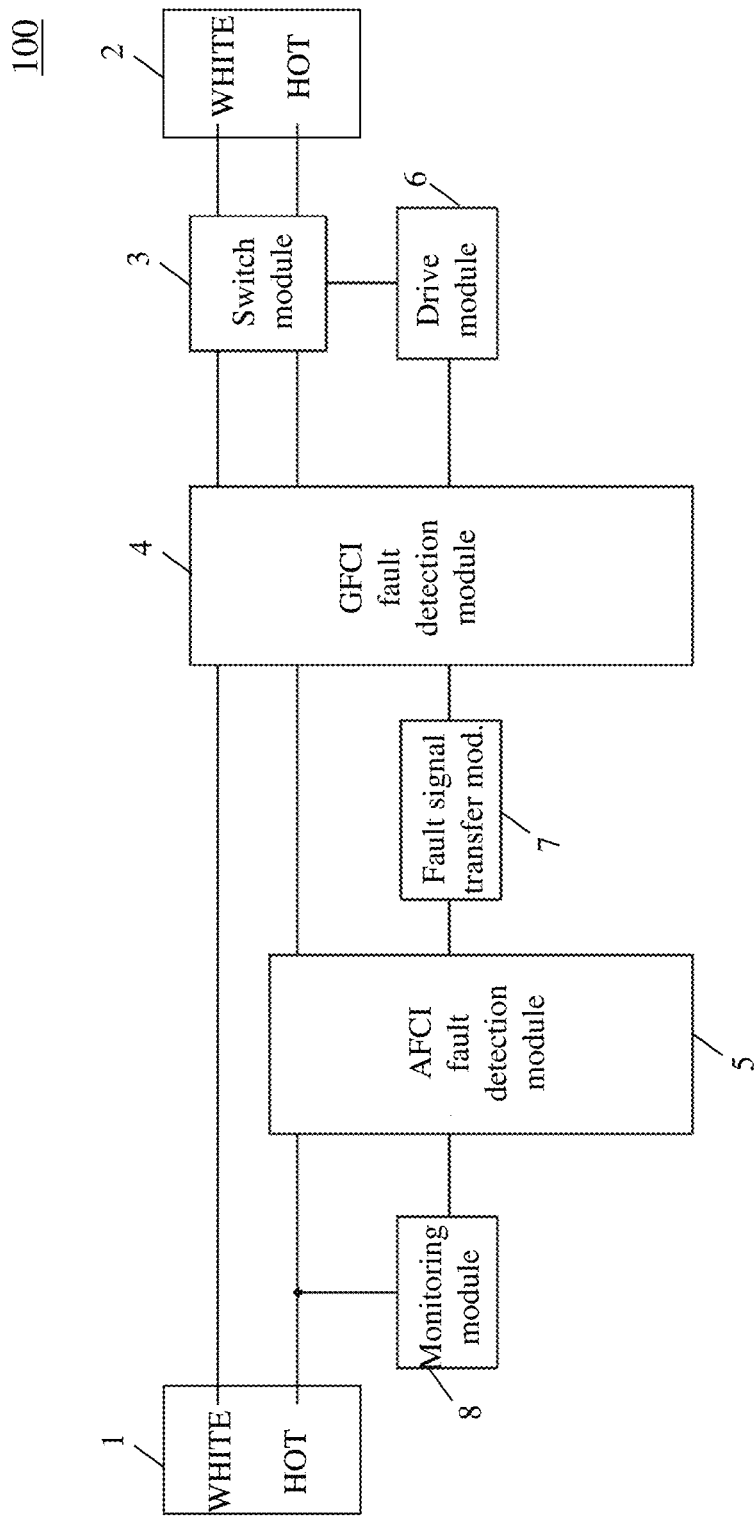
FIG. 1 is a block diagram showing an electrical fault detection and interruption device according to an embodiment of the present invention.

REFERENCE SYMBOLS input end 1, 1'
output end 2, 2'
switch module 3, 3'
GFCI fault detection module 4, 4'
leakage current signal processing module 41, 41'
self-test module 42, 42'
AFCI fault detection module 5, 5'
arc signal processing module 51, 51'
window gate module 52, 52'
drive module 6, 6'
fault signal transfer module 7, 7'
monitoring module 8, 8'
alarm module 9, 9'

DETAILED DESCRIPTION OF THE INVENTION

Preferred embodiments of the present invention are described below with reference to the drawings. These drawings and descriptions explain embodiments of the invention but do not limit the invention. The described embodiments are not all possible embodiments of the present invention. Other embodiments are possible without departing from the spirit and scope of the invention, and the structure and/or logic of the illustrated embodiments may be modified. Thus, it is intended that the scope of the invention is defined by the appended claims.

Before describing the embodiments, some terms used in this disclosure are defined here to help the reader better understand this disclosure.

In this disclosure, terms such as "connect", "couple", "link" etc. should be understood broadly, without limitation to physical connection or mechanical connection, but can include electrical connection, and can include direct or indirection connections. Terms such as "a" and "one" do not limit the quantity, and refers to "at least one".

In the descriptions below, terms such as "including" are intended to be open-ended and mean "including without limitation", and can include other contents. "Based on" means "at least partly based on." "An embodiment" means "at least one embodiment." "Another embodiment" means "at least another embodiment," etc. In this disclosure, the above terms do not necessarily refer to the same embodiments. Further, the various features, structures, materials or characteristics may be suitably combined in any of the one or more embodiments. Those of ordinary skill in the art may combine the various embodiments and various characteristics of the embodiments described herein when they are not contrary to each other.

In this disclosure, a transistor may be of any type and structure, such as field-effect transistor (FET), bipolar junction transistor (BJT), silicon controlled rectifier (SCR), etc. When the transistor is a FET, the control electrode refers to the gate of the FET, the first electrode may be the drain or source of the FET, and the corresponding second electrode may be the source or drain of the FET. When the transistor is a BJT, the control electrode refers to the base of the BJT, the first electrode may be the collector or emitter of the BJT, and the corresponding second electrode may be the emitter or collector of the BJT. When the transistor is an SCR, the control electrode refers to the control electrode G of the SCR, the first electrode may be the anode, and the corresponding second electrode may be the cathode. For example, a switching semiconductor device may be a transistor or devices with similar functions.

In this disclosure, a simulated leakage current signal is a periodic signal generated by a self-test module. Because it has a relatively short duration, although the leakage current detection module can detect the simulated leakage current signal, it will not cause the device to trip and interrupt the power connection.

Embodiments of the present invention provide an electrical fault detection and interruption device, which integrates GFCI and AFCI functions, and can also detect malfunction in both. This offers more convenience to users.

FIG. 1 is a block diagram showing an electrical fault detection and interruption device 100 according to an embodiment of the present invention.

As shown in FIG. 1, the electrical fault detection and interruption device 100 includes an input end 1, an output end 2, a switch module 3, a GFCI fault detection module 4, an AFCI fault detection module 5, a drive module 6, a fault signal transfer module 7, and a monitoring module 8. The switch module 3 is coupled between the input end 1 and the output end 2. The power supply lines are coupled between the input end 1 and the output end 2, and include a first current carrying line (L) (HOT) for coupling to the hot line of the power source and a second current carrying line (N) (WHITE) for coupling to the neutral line of the power source. The output end 2 is coupled to an electrical load (LOAD), such as an electrical appliance or a power strip. When the load draws power, a current path is formed between the first and second current carrying lines.

The GFCI fault detection module 4 is coupled between the input end 1 and the output end 2, and functions to detect a leakage current on the current carrying lines and to generate a ground fault signal when a leakage current is detected. The AFCI fault detection module 5 is coupled to a current carrying line, and functions to detect harmful arcs on the current carrying lines and to generate an arc fault signal when harmful arcs are detected. The fault signal transfer module 7 is coupled between the AFCI fault detection module 5 and the GFCI fault detection module 4, and functions to generate a first simulated leakage current in response to the arc fault signal.

The monitoring module 8 functions to generate a simulated harmful arc signal, used to detect whether the functions of the electrical fault detection and interruption device 100 (including the GFCI function and AFCI function) are normal. The drive module 6 is coupled to the GFCI fault detection module 4, and functions to drive the switch module 3 in response to the ground fault signal and/or arc fault signal to disconnect the electrical connection between the input end 1 and the output end 2. In other words, if the GFCI fault detection module 4 can detect the leakage current and the AFCI fault detection module 5 can detect the harmful arcs, and cause the drive module 6 to drive the switch module 3 to disconnect the power, then it indicates that the electrical fault detection and interruption device 100 is functioning normally; otherwise, it indicates that the device is not functioning normally (abnormal).

Figure 2:
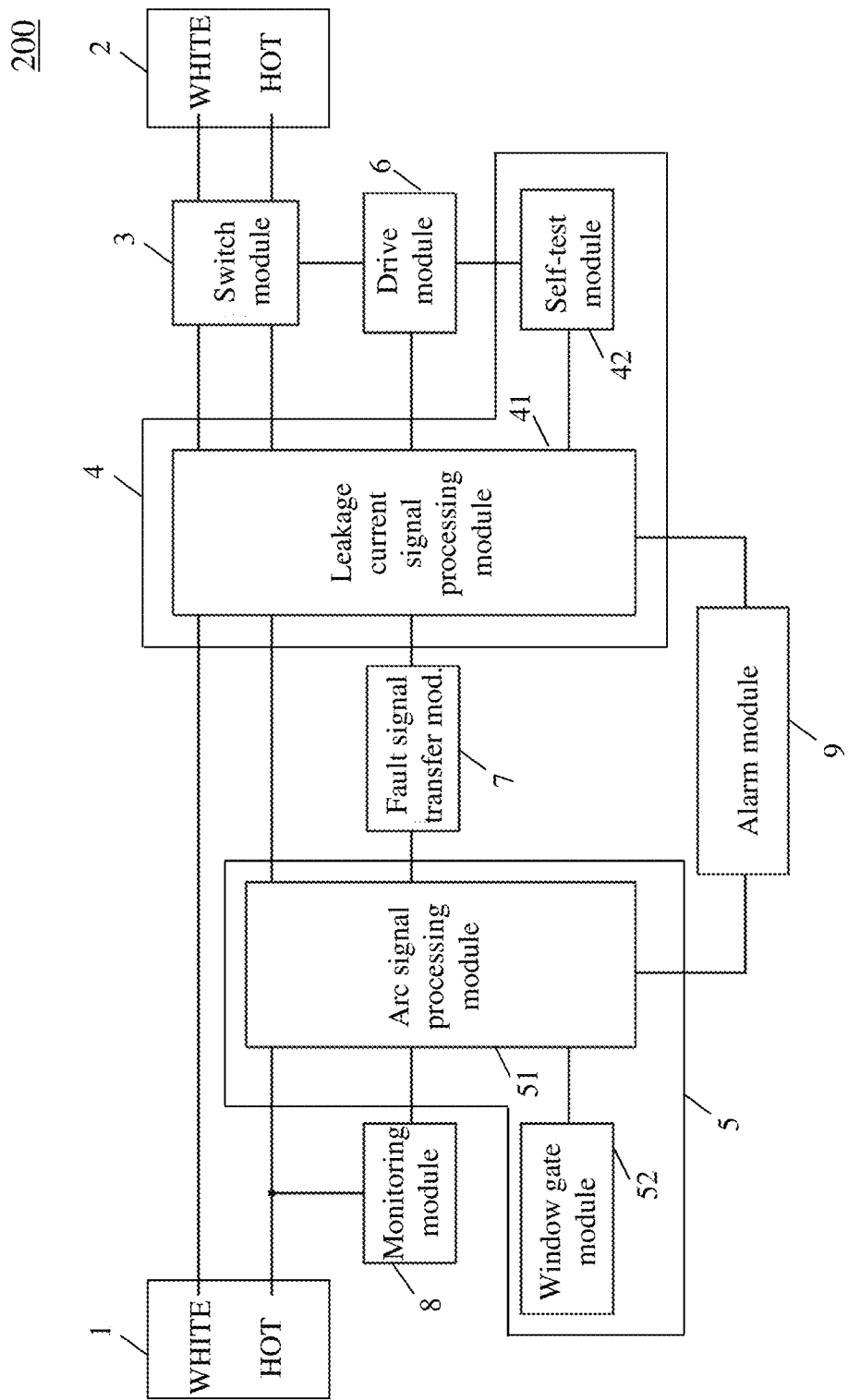
FIG. 2 is a block diagram showing an electrical fault detection and interruption device according to an embodiment of the present invention.

FIG. 2 is a block diagram showing an electrical fault detection and interruption device 200 according to an embodiment of the present invention.

The electrical fault detection and interruption device 200 is similar to the electrical fault detection and interruption device 100, and includes a switch module 3, a GFCI fault detection module 4, an AFCI fault detection module 5, a drive module 6, a fault signal transfer module 7, and a monitoring module 8. As shown in FIG. 2, the GFCI fault detection module 4 includes a leakage current signal processing module 41 and a self-test module 42. The leakage current signal processing module 41 is configured to detect a leakage current on the current carrying lines, and to generate a ground fault signal when the leakage current exceeds a predetermined threshold. The self-test module 42 is configured to periodically generate a second simulated leakage current, to test whether the leakage current signal processing module 41 is functioning normally.

As shown in FIG. 2, the AFCI fault detection module 5 includes an arc signal processing module 51 and a window gate module 52. The arc signal processing module 51 is configured to detect arc signals on the current carrying line, and to generate an arc fault signal when detecting harmful arcs on the current carrying line. The window gate module 52 is coupled to the arc signal processing module 51, and configured to cooperate with the arc signal processing module 51 to determine whether harmful arcs are present in the current signal on the current carrying line. The electrical fault detection and interruption device 200 optionally includes an alarm module 9, configured to generate a corresponding alarm signal (e.g., visible alarm signal, audible alarm signal, etc.) in response to the ground fault signal and/or arc fault signal, to indicate to the user that a ground fault and/or arc fault has occurred.

Figure 3:
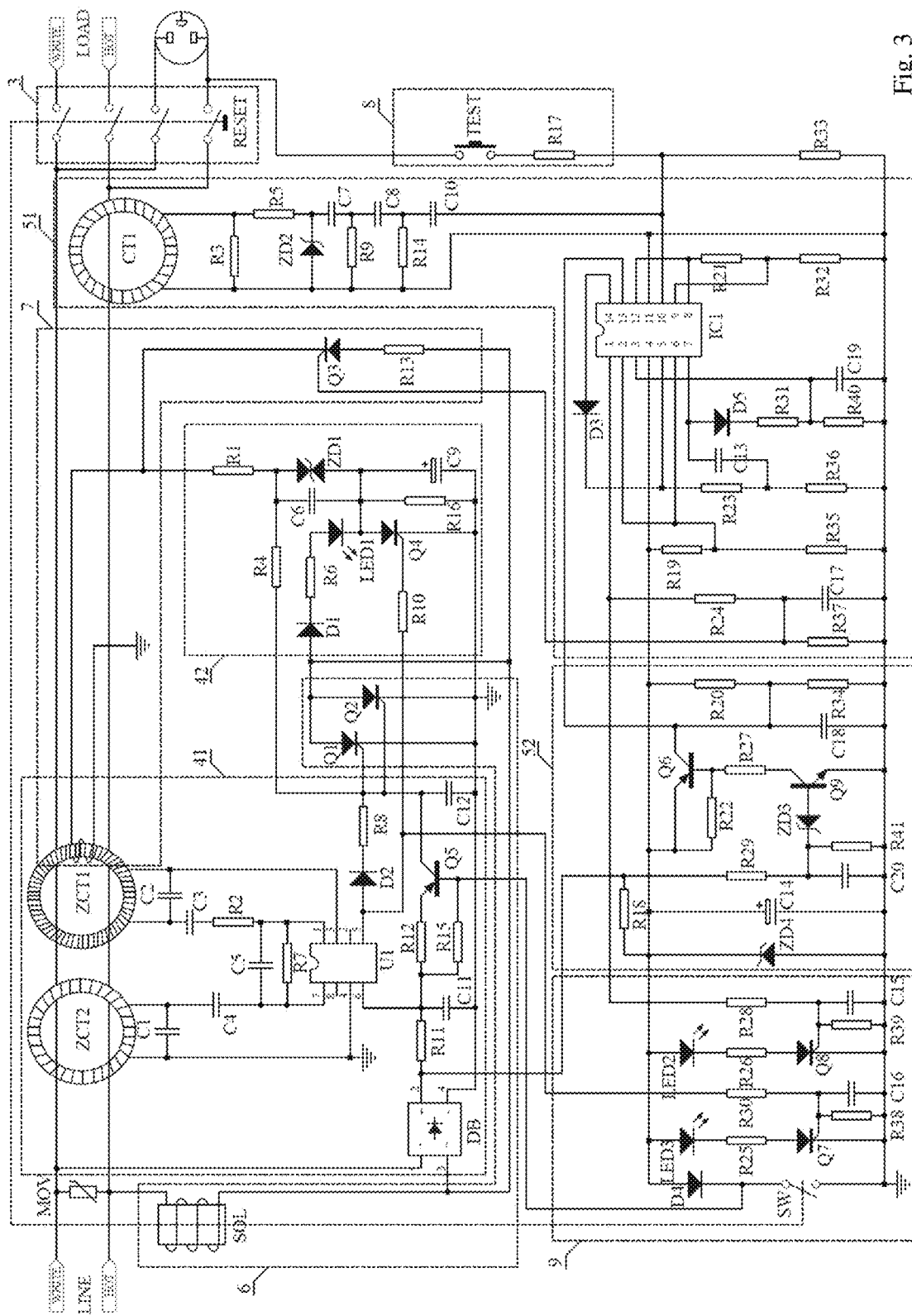
FIG. 3 is a circuit diagram of a first implementation of an electrical fault detection and interruption device according to the embodiments of FIGS. 1 and 2.

FIG. 3 is a circuit diagram of a first circuit 300 that implements an electrical fault detection and interruption device according to the embodiments of FIGS. 1 and 2. The circuit 300 includes a switch module 3, a GFCI fault detection module 4 (including leakage current signal processing module 41 and self-test module 42), an AFCI fault detection module 5 (including arc signal processing module 51 and window gate module 52), a drive module 6, a fault signal transfer module 7, a monitoring module 8, and an alarm module 9.

As shown in FIG. 3, the electrical fault detection and interruption device is coupled to the current carrying lines between the input end LINE and the output end LOAD and a receptacle. The current carrying lines include a first current carrying line HOT and a second current carrying line WHITE. The switch module 3 includes a reset switch RESET coupled between the input end LINE and the output end LOAD and receptacle.

The leakage current signal processing module 41 of the GFCI fault detection module 4 includes a neutral line detection ring ZCT2, a leakage current detection ring ZCT1, a leakage current processing chip or processor U1, a rectifier diode bridge DB1, as well as various resistors and capacitors used in conjunction with the above components. The leakage current detection ring ZCT1 has the first current carrying line HOT and the second current carrying line WHITE pass through it, and functions to detect whether there is a leakage current between the first current carrying line HOT and the second current carrying line WHITE. It collects the leakage current signal and couples it to the leakage current detection chip U1, which compares the leakage current signal to a predetermined threshold and generates a ground fault signal when the leakage current signal exceeds the predetermined threshold. The self-test module 42 of the GFCI fault detection module 4 includes a switching semiconductor device Q4, a current regulator (Zener diode) ZD1, a diode D1, and peripheral circuit components used in combination with the above components.

The arc signal processing module 51 of the AFCI fault detection module 5 includes a current transformer CT1, a filter circuit (capacitors C7, C8, C10 and resistors R5, R9, R14), arc detection chip IC1, and peripheral circuit components used in combination with the above components. The arc signal processing module 51 is configured to detect arc signals on the current carrying line and generate an arc fault signal when harmful arcs are present on the current carrying line. The window gate module 52 of the AFCI fault detection module 5 is coupled to the arc signal processing module 51, and configured to cooperate with the arc signal processing module 51 to determine whether harmful arcs are present in the current signal on the current carrying line. The window gate module 52 is configured to output a window gate signal, and the arc signal processing module 51 is configured to detect arc signals on the current carrying line based on the window gate signal. The window gate module 52 helps the arc signal processing module 51 to detect harmful arcs based on a pulse signal (window gate signal), which narrows the time window for making the determination, improves detection accuracy, and shields possible interfering signals, thereby avoiding mistaken arc detection.

The drive module 6 includes a solenoid SOL and at least one switching semiconductor device. In the embodiment of FIG. 3, the at least one switching semiconductor device is implemented by two parallel coupled switching semiconductor devices Q1 and Q2 (e.g., transistors). In other embodiments, the at least one switching semiconductor device may include more or fewer transistors. The solenoid SOL is coupled to the input end LINE (e.g., first current carrying line HOT), and coupled to the switching semiconductor devices Q1 and Q2. The solenoid SOL is configured to generate an electromagnetic force to drive the reset switch RESET. In the embodiment of FIG. 3, the input electrodes of switching semiconductor devices Q1 and Q2 are coupled to the solenoid SOL, and their control electrodes are coupled to pin 5 of leakage current detection chip U1 and self-test module 42.

The fault signal transfer module 7 includes switching semiconductor device Q3 and resistor R13, and is configured to, in response to the arc fault signal, generate a simulated leakage current (first simulated leakage current, different from the simulated leakage current generated by the self-test module 42 described below).

The monitoring module 8 is coupled to the current carrying lines, and includes a test switch TEST and resistor R17. It is configured to generate a simulated harmful arc signal, which is used to detect whether the functions of the electrical fault detection and interruption device (including the GFCI function and AFCI function) are normal.

The alarm module 9 is coupled to the GFCI fault detection module 4 and AFCI fault detection module 5. The alarm module alarm module 9 includes serial connected switching semiconductor device Q7 and light emitting diode LED3, serial connected switching semiconductor device Q8 and light emitting diode LED2, and auxiliary switch SW. The upper ends of light emitting diodes LED2 and LED3 are coupled to diode D4, and the auxiliary switch SW is coupled between diode D4 and ground. The alarm module 9 is configured to generate a corresponding alarm signal in response to the ground fault signal and/or arc fault signal. The auxiliary switch SW (mechanically linked to the reset switch) clears the alarm of the alarm module 9 when the switch module 3 is reset.

When the circuit 300 performs zero sequence current detection, the reset switch RESET is closed. When the currents on the first current carrying line HOT and second current carrying line WHITE are balanced, the leakage current detection ring ZCT1 does not generate an imbalance current. When a zero sequence current fault is present on the current carrying lines (first current carrying line HOT or second current carrying line WHITE), the leakage current detection ring ZCT1 detects the zero sequence current fault and generates a corresponding induced signal. The leakage current detection ring ZCT1 is coupled to pins 1 and 3 of the leakage current detection chip U1, to input the induced signal to the leakage current detection chip U1. When the zero sequence fault current signal is above a predefined threshold, pin 5 of the leakage current detection chip U1 outputs a high voltage level (ground fault signal), otherwise it outputs a low voltage level. The high voltage level at pin 5 is coupled via diodes D2 and resistor R8 to the control electrodes of switching semiconductor devices Q1 and Q2 of the drive module 6, triggering the switching semiconductor devices Q1 and/or Q2 to become conductive. As a result, a large current flows through the solenoid SOL, generating a magnetic force to drive the reset switch RESET to disconnect the electrical connection between the input and output ends.

Meanwhile, the high voltage level at pin 5 of the leakage current detection chip U1 is also coupled to the alarm module 9, which includes a resistor R30, a switching semiconductor device Q7 and a light emitting diode LED3. The high voltage level at pin 5 is coupled to the control electrode of switching semiconductor device Q7 via resistor R30, triggering switching semiconductor device Q7 to become conductive and remain conductive. As a result, a current flows through light emitting diode LED3, so that it emits a light signal (alarm signal) to alert the user that a zero sequence current fault (ground fault) has occurred. In other embodiments, the light emitting diode LED3 may be replaced by a buzzer or speaker (not shown in the drawings) to generate an audible alarm signal. Because the high voltage level at pin 5 is coupled to both the drive module 6 and the alarm module 9, if the circuit 300 malfunctions (e.g., the drive module 6 malfunctions) and the tripping function is lost, i.e., the device cannot disconnect the electrical connection between the input and output ends, the alarm module 9 can still generate the alarm signal to alert the user.

Further, the self-test module 42 of the circuit 300 has a self-test function to test whether the leakage current signal processing module 41 is functioning normally. The first current carrying line HOT charges capacitor C9 via a current path formed by SOL-D1-R6-LED1. After a pre-determined time period, the voltage level at the upper end of capacitor C9 exceeds the trigger voltage of Zener diode ZD1, so Zener diode ZD1 becomes conductive, and a simulated zero sequence current fault signal (second simulated leakage current) is generated via resistor R1. The leakage current detection ring ZCT1 detects the zero sequence current fault signal and generates a corresponding induced signal, which is input to the leakage current detection chip U1. The leakage current detection chip U1 outputs a high voltage level at its pin 5 (self-test fault signal), which is coupled to the control electrode of the switching semiconductor device Q4, triggering it to be conductive. Capacitor C9 is discharged via switching semiconductor device Q4, so the voltage at its upper end rapidly decreases to a level below the trigger voltage of Zener diode ZD1. As a result, Zener diode ZD1 is off and the simulated zero sequence current fault signal is no longer generated, and pin 5 of leakage current detection chip U1 now outputs a low voltage level. This process (from start to end of the simulated zero sequence current fault signal generation) repeats itself periodically. The process occurs in a very short time period; by appropriately setting the capacitance of capacitor C12, the voltage level at the upper end of capacitor C12 increases slowly during this process, insufficient to trigger switching semiconductor devices Q1 and Q2 to become conductive, and therefore does not affect the normal function of the circuit 300. On the other hand, if the leakage current detection ring ZCT1 malfunctions, then pin 5 of leakage current detection chip U1 does not output the high voltage level. As a result, switching semiconductor device Q4 remains non-conductive, capacitor C9 continues to trigger Zener diode ZD1 to conduct, and the current through resistor R4 continuously charges capacitor C12. The voltage across capacitor C12 continuously increases, and when it exceeds a certain level, switching semiconductor devices Q1 and/or Q2 are triggered to conduct. This causes a large current to flow through the solenoid SOL, generating a magnetic force to drive the reset switch RESET to disconnect the electrical connection between the input and output ends. It also causes light emitting diode LED1 to emit light, alerting the user that the circuit 300 malfunctioned and needs to be replaced.

When the circuit 300 performs arc detection, the reset switch RESET is closed. When an arc fault is present on the current carrying line, the current transformer CT1 detects the arc signal, and converts it to a secondary current signal, which is converted to a secondary voltage signal by the parallel coupled resistor R3. This signal is filtered by the filter circuit formed by capacitors C7, C8, C10 and resistors R2, R3, and R5, so that the characteristics arc signal (e.g., voltage waveform in the frequency range of arcs) is preserved. The Zener diode ZD2 voltage-regulates the filtered voltage waveform. The window gate module 52 generates a periodic signal with a certain duty cycle, so as to select the voltage signal within predefined time intervals of the AC periods (window gating). Based on the gated voltage signal, the arc detection chip IC1 determines whether the arc fault is a harmful arc fault. If it is a harmful arc fault, the arc detection chip IC1 outputs a high voltage level (arc fault signal) at its pin 1; otherwise, it outputs a low voltage level at pin 1. The high voltage level at pin 1 of arc detection chip IC1 is coupled via resistor R24 to the control electrode of switching semiconductor device Q3, which triggers switching semiconductor device Q3 to become conductive. As a result, a current flows through the current path formed by HOT-SOL-R13-Q3-ZCT1-DB-WHITE to form a simulated leakage current. The leakage current detection ring ZCT1 detects this simulated leakage current, and pin 5 of the leakage current detection chip U1 outputs a high voltage level to triggering the switching semiconductor devices Q1 and/or Q2 to become conductive. As a result, a large current flows through the solenoid SOL, generating a magnetic force to drive the reset switch RESET to disconnect the electrical connection between the input and output ends.

Meanwhile, the high voltage level at pin 1 of arc detection chip IC1 is coupled via resistor R28 to the control electrode of switching semiconductor device Q8, which triggers switching semiconductor device Q8 to become conductive and remain conductive. As a result, a current flows through light emitting diode LED2, so that it emits a light signal (alarm signal) to alert the user that an arc fault has occurred.

When performing reset, the user manually depresses the reset switch RESET. By the linked mechanical structure, when the reset switch RESET is depressed, the auxiliary switch SW is also closed. However, the downward movement of the reset switch RESET is blocked by a metal plate (blocking plate) in the trip mechanism. Because the auxiliary switch SW is closed, the voltage level of the upper end of the light emitting diode LED3 becomes low (as it is grounded via diode D4), so the current no longer flows through the light emitting diode LED3 and switching semiconductor device Q7, and the light emitting diode LED3 is extinguished. Similarly, the voltage level of the upper end of the light emitting diode LED2 becomes low (as it is grounded via diode D4), so the current no longer flows through the light emitting diode LED2 and switching semiconductor device Q8, and the light emitting diode LED2 is extinguished.

Meanwhile, the closing of the auxiliary switch SW also causes switching semiconductor device Q3 to become conductive, triggering switching semiconductor devices Q1 and/or Q2 to become conductive. As a result, a large current flows through the solenoid SOL, generating a magnetic force to move away the metal plate (blocking plate) that was blocking the downward movement of reset switch RESET, so that the reset switch RESET, which is still being depressed by the user, can continue to move downwards to a locked position, i.e., reset is now complete. At this time, when the user releases the reset switch RESET, the auxiliary switch SW becomes open. Thus, in the embodiment of FIG. 3, the same auxiliary switch SW both assists the reset switch RESET to reset and clears the alarm signals (ground fault alarm and/or arc fault alarm). This simplifies the circuit structure, reduces the space required, and lowers cost.

Moreover, the circuit 300 allows testing of the GFCI and/or AFCI function. The test is performed when the reset switch RESET is closed. The user manually closes the test switch TEST of the monitoring module 8, so a simulated arc fault signal is generated from the first current carrying line HOT via resistor R17 and coupled to pin 10 of the arc detection chip IC1. If the AFCI fault detection module 5 is functioning normally, the arc detection chip IC1, along with its peripheral components, processes the simulated arc fault signal and determines that a harmful arc fault occurred, and outputs a high voltage level (arc fault signal) at its pin 1. This signal is coupled to the control electrodes of switching semiconductor device Q3, triggering it to become conductive to generate a simulated leakage current. If the GFCI fault detection module 4 is functioning normally, the leakage current detection chip U1 generates a high voltage level at its pin 5, triggering switching semiconductor devices Q1 and/or Q2 to become conductive, which in turn causes solenoid SOL to drive the reset switch RESET of switch module 3 to disconnect the electrical connection between the input end and output end. This indicates that the electrical fault detection and interruption device is functioning normally. If the AFCI fault detection module 5 is not functioning normally, the switching semiconductor device Q3 cannot be triggered to generate the simulated leakage signal, so the device does not trip. Likewise, if the GFCI fault detection module 4 is not functioning normally, the device does not trip either. Therefore, by using the monitoring module 8 and the fault signal transfer module 7 to test the normal GFCI and/or AFCI functions, malfunction of the electrical fault detection and interruption device can be discovered, and the user is reminded to replace the device.

Figure 4:
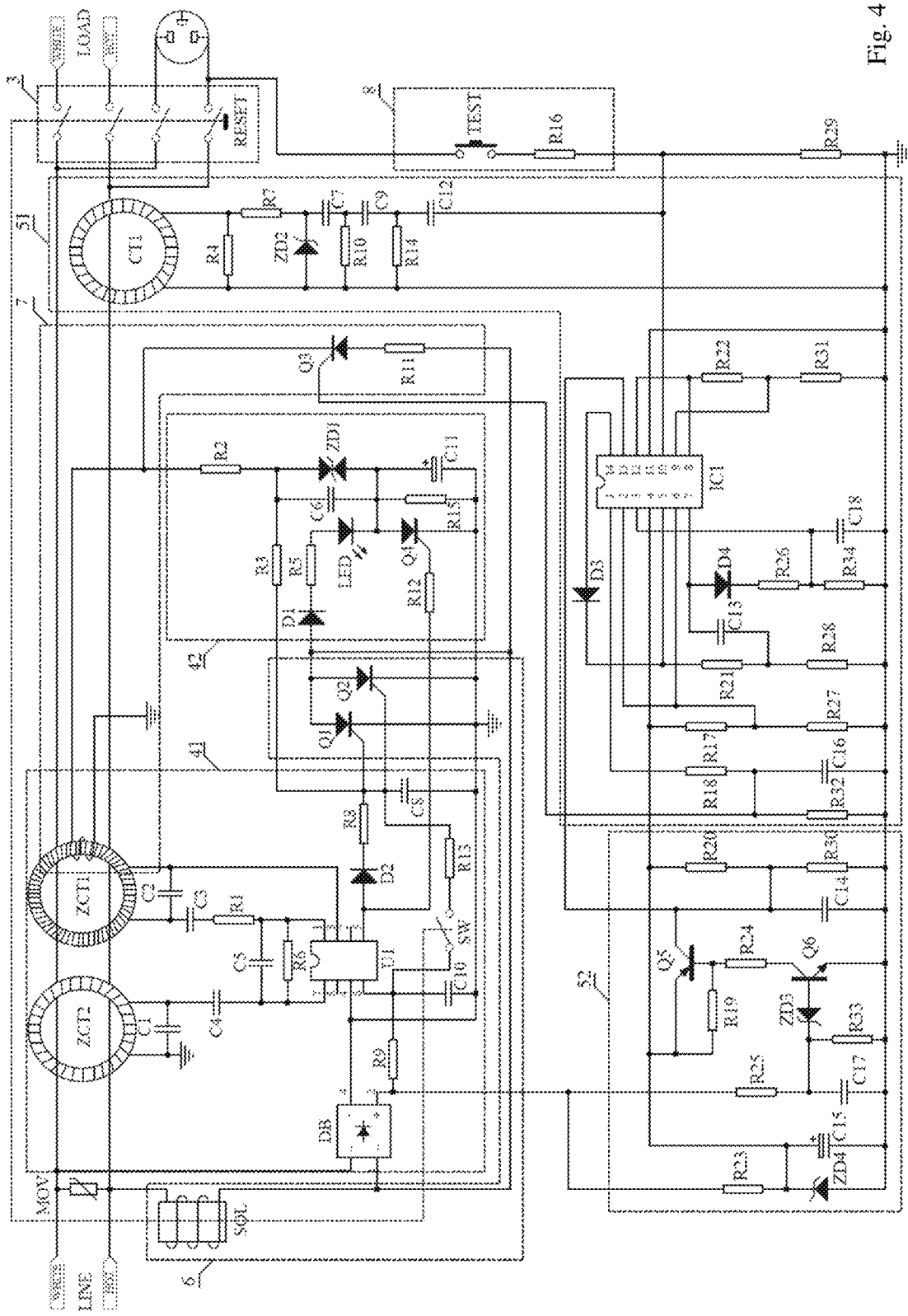
FIG. 4 is a circuit diagram of a second implementation of an electrical fault detection and interruption device according to the embodiments of FIGS. 1 and 2.

FIG. 4 is a circuit diagram of a second circuit 400 that implements an electrical fault detection and interruption device according to the embodiments of FIGS. 1 and 2.

The circuit 400 is similar to the circuit 300 of FIG. 3, except that it does not have an alarm module 9, and the auxiliary switch SW of FIG. 4 is coupled between pin 2 of diode bridge DB and the control electrodes of switching semiconductor devices Q1 and Q2. The auxiliary switch SW in FIG. 4 functions in similar ways relating to the reset switch RESET as the auxiliary switch SW in FIG. 3, but does not clear alarm signals (as circuit 400 does not have an alarm module).

Figure 5:
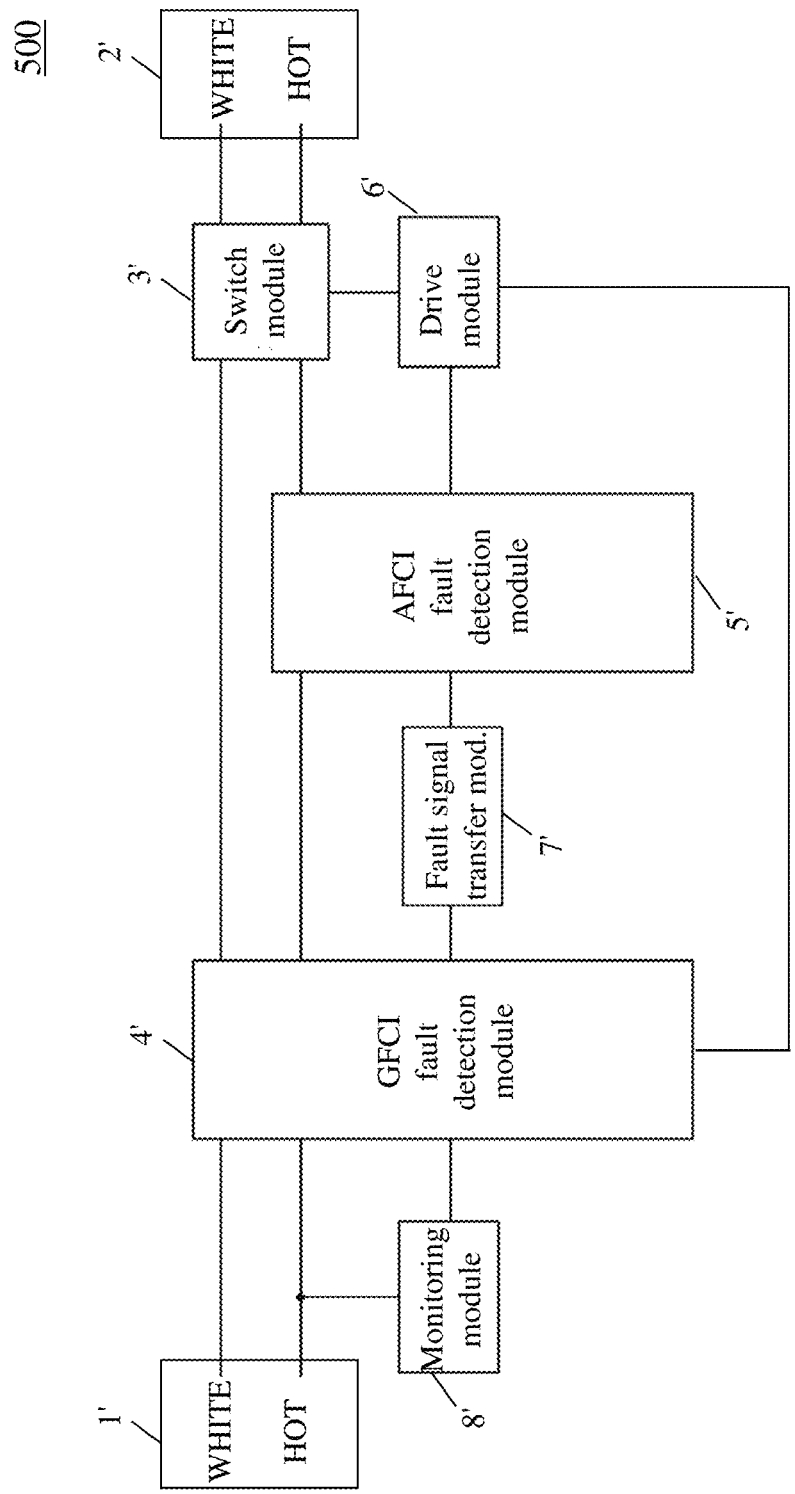
FIG. 5 is a block diagram showing an electrical fault detection and interruption device according to an embodiment of the present invention.

FIG. 5 is a block diagram showing an electrical fault detection and interruption device 500 according to an embodiment of the present invention.

As shown in FIG. 5, the electrical fault detection and interruption device 500 includes an input end 1', an output end 2', a switch module 3', a GFCI fault detection module 4', an AFCI fault detection module 5', a drive module 6', a fault signal transfer module 7', and a monitoring module 8'. The switch module 3' is coupled between the input end 1' and the output end 2'. The power supply lines include a first current carrying line (L) (HOT) for coupling to the hot line of the power source, and a second current carrying line (N) (WHITE) for coupling to the neutral line of the power source. The output end 2' is coupled to an electrical load (LOAD), such as an electrical appliance or a power strip. When the load draws power, a current path is formed between the first and second current carrying lines.

The GFCI fault detection module 4' is coupled between the input end 1' and the output end 2', and functions to detect a leakage current on the current carrying lines and to generate a ground fault signal when a leakage current is detected. The AFCI fault detection module 5' is coupled to a current carrying line, and functions to detect harmful arcs on the current carrying line and to generate an arc fault signal when harmful arcs are detected. The fault signal transfer module 7' is coupled between the AFCI fault detection module 5' and the GFCI fault detection module 4', and functions to generate a simulated harmful arc signal in response to the ground fault signal.

The monitoring module 8' functions to generate a simulated leakage current signal, used to detect whether the functions of the electrical fault detection and interruption device 500 (including the GFCI function and AFCI function) are normal. The drive module 6' is coupled to the AFCI fault detection module 5', and functions to drive the switch module 3' in response to the ground fault signal and/or arc fault signal to disconnect the electrical connection between the input end 1' and the output end 2'. In other words, if the GFCI fault detection module 4' can detect the leakage current and the AFCI fault detection module 5' can detect the harmful arcs, and cause the drive module 6' to drive the switch module 3' to disconnect the power, then it indicates that the electrical fault detection and interruption device 500 is functioning normally; otherwise, it indicates that the device is not functioning normally (abnormal).

Figure 6:
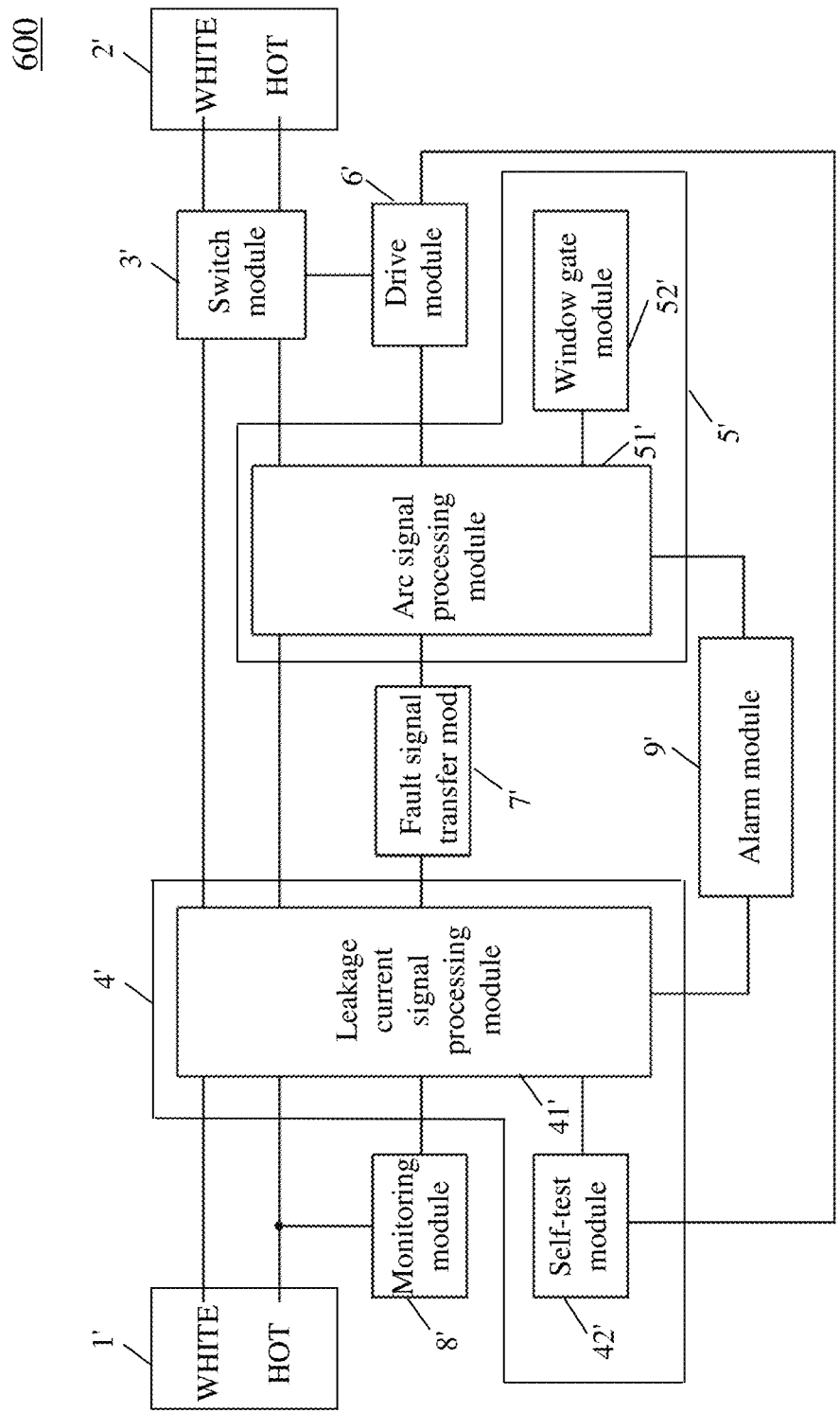
FIG. 6 is a block diagram showing an electrical fault detection and interruption device according to an embodiment of the present invention.

FIG. 6 is a block diagram showing an electrical fault detection and interruption device 600 according to an embodiment of the present invention.

The electrical fault detection and interruption device 600 is similar to the electrical fault detection and interruption device 500, and includes a switch module 3', a GFCI fault detection module 4', an AFCI fault detection module 5', a drive module 6', a fault signal transfer module 7', and a monitoring module 8'. As shown in FIG. 6, the GFCI fault detection module 4' includes a leakage current signal processing module 41' and a self-test module 42', similar to the leakage current signal processing module 41 and self-test module 42 of FIG. 2. As shown in FIG. 6, the AFCI fault detection module 5' includes an arc signal processing module 51' and a window gate module 52', similar to the arc signal processing module 51 and window gate module 52 of FIG. 2. The electrical fault detection and interruption device 600 optionally includes an alarm module 9', similar to the alarm module 9 of FIGS. 2 and 3.

Figure 7:
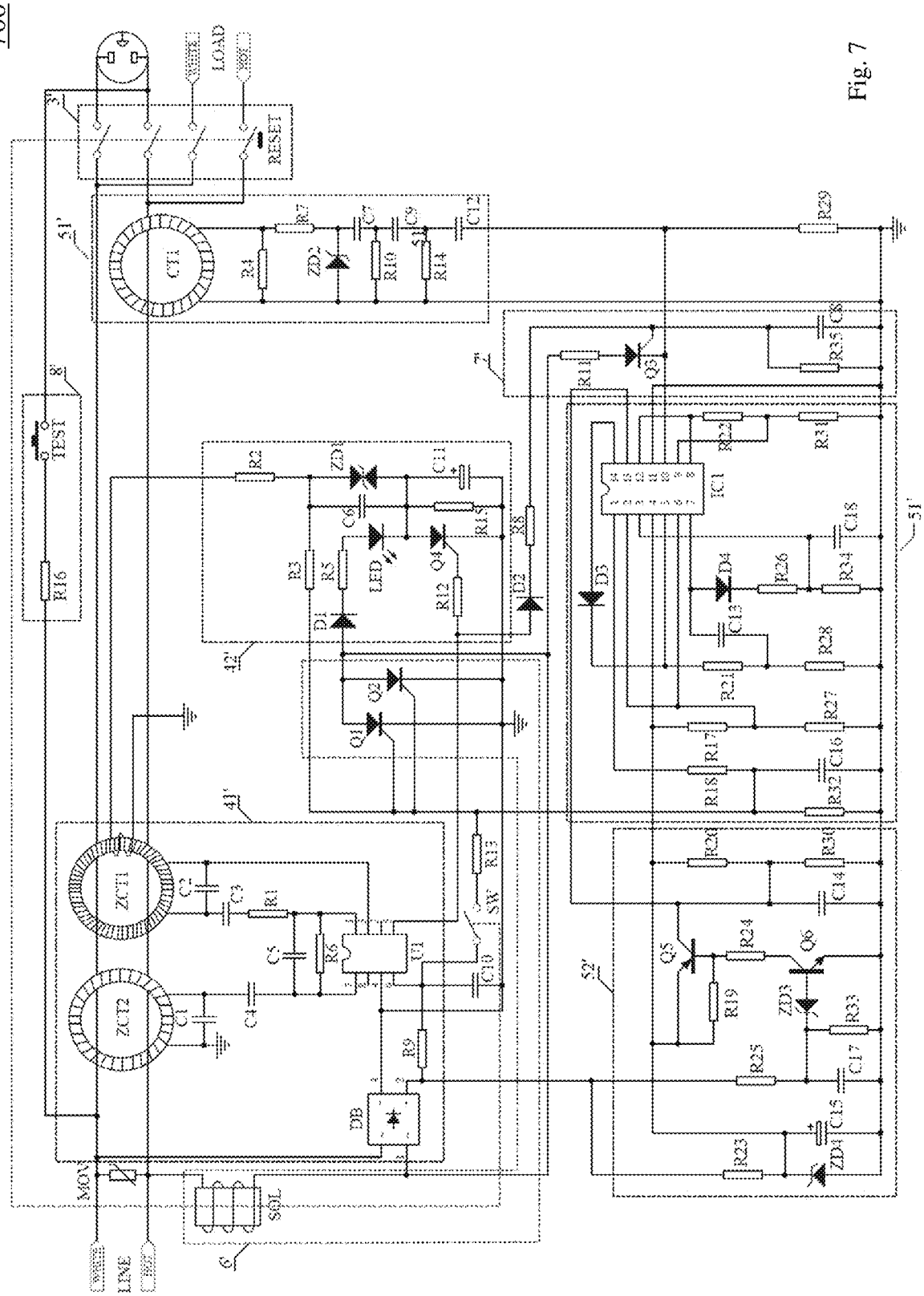
FIG. 7 is a circuit diagram of an implementation of an electrical fault detection and interruption device according to the embodiments of FIGS. 5 and 6.

FIG. 7 is a circuit diagram of a circuit 700 that implements an electrical fault detection and interruption device according to the embodiments of FIGS. 5 and 6. The circuit 700 includes a switch module 3', a GFCI fault detection module 4' (including leakage current signal processing module 41' and self-test module 42'), an AFCI fault detection module 5' (including arc signal processing module 51' and window gate module 52'), a drive module 6', a fault signal transfer module 7', and a monitoring module 8'.

The switch module 3', GFCI fault detection module 4' (including leakage current signal processing module 41' and self-test module 42'), AFCI fault detection module 5' (including arc signal processing module 51' and window gate module 52'), and drive module 6' are respectfully similar to the corresponding modules of the circuit 300 of FIG. 3 and circuit 400 of FIG. 4, and their detailed descriptions are omitted here.

The fault signal transfer module 7' includes switching semiconductor device Q3 and resistor R11, and is configured to generate a simulated harmful arc signal.

The monitoring module 8' is coupled to the current carrying lines, and includes a test switch TEST and resistor R16. It is configured to generate simulated leakage current signal, which is used to detect whether the functions of the electrical fault detection and interruption device (including the GFCI function and AFCI function) are normal.

When the circuit 700 performs arc detection, the reset switch RESET is closed. When an arc fault is present on the current carrying line, the current transformer CT1 of the arc signal processing module 51' detects the arc fault signal, and converts it to a secondary current signal, which is converted to a secondary voltage signal by the parallel coupled resistor R4. This signal is filtered by the filter circuit formed by capacitors C7, C9, C12 and resistors R7, R10, and R14, so that the characteristics arc signal (e.g., voltage waveform in the frequency range of arcs) is preserved. The Zener diode ZD2 voltage-regulates the filtered voltage waveform. The window gate module 52' generates a periodic signal with a certain duty cycle, so as to select the voltage signal within predefined time intervals of the AC periods (window gating). Based on the gated voltage signal, the arc detection chip IC1 determines whether the arc fault is a harmful arc fault. If it is a harmful arc fault, the arc detection chip IC1 outputs a high voltage level (arc fault signal) at its pin 1; otherwise, it outputs a low voltage level at pin 1. The high voltage level at pin 1 of arc detection chip IC1 is coupled via resistor R18 to the control electrode of switching semiconductor devices Q1 and Q2, which triggers switching semiconductor devices Q1 and/or Q2 to become conductive. As a result, a large current flows through the solenoid SOL, driving the reset switch RESET of switch module 3' to disconnect the electrical connection between the input and output ends.

When the circuit 700 performs zero sequence current detection, the reset switch RESET is closed. When a zero sequence current fault is present on the current carrying lines, the leakage current detection ring ZCT1 detects the zero sequence current fault and generates a corresponding induced signal. This signal is processed by the leakage current detection chip U1, which outputs a high voltage level at its pin 5 if the zero sequence fault current signal is above a predefined threshold. The high voltage level at pin 5 triggers switching semiconductor device Q3 of the fault signal transfer module 7' to become conductive. As a result, a current flows through resistor R11 to generate a signal for the arc signal processing module 51' to simulate a harmful arc signal. The arc detection chip IC1, along with its peripheral components, processes this signal and determines that harmful arcs occurred, and outputs a high voltage level (arc fault signal) at its pin 1 to trigger switching semiconductor devices Q1 and/or Q2 to become conductive. As a result, large current flows through the solenoid SOL, driving the reset switch RESET of switch module 3' to disconnect the electrical connection between the input and output ends.

When the user performs a reset by pressing the reset switch RESET of the switch module 3', the auxiliary switch SW is closed, triggering switching semiconductor devices Q1 and/or Q2 to become conductive, so that a large current flows through solenoid SOL. Once reset is completed, the auxiliary switch SW becomes open. The reset process is similar to that of the circuit of FIG. 3.

Moreover, the circuit 700 allows testing of the GFCI and/or AFCI function. The test is performed when the reset switch RESET is closed. The user manually closes the test switch TEST of the monitoring module 8', a current flows through resistor R16 to generate a simulated leakage current. If the GFCI fault detection module is functioning normally, pin 5 of leakage current detection chip U1 outputs a high voltage level to trigger switching semiconductor device Q3 to be conductive, which in turn generates a simulated arc signal. If the AFCI fault detection module is functioning normally, pin 1 of arc detection chip IC1 outputs a high voltage level to trigger switching semiconductor devices Q1 and/or Q2 to be conductive. As a result, a large current flows through the solenoid SOL, driving the reset switch RESET of the switch module to disconnect the electrical connection between the input and output ends. This indicates that the electrical fault detection and interruption device is functioning normally. If the GFCI fault detection module is not functioning normally, the switching semiconductor device Q3 cannot be triggered to generate the simulated leakage signal, so the device does not trip. Similarly, if the AFCI fault detection module is not functioning normally, the device does not trip either.

Further, the self-test module 42' of the circuit 700 has a self-test function to test whether the leakage current signal processing module 41' is functioning normally. The first current carrying line HOT charges capacitor C11 via a current path formed by SOL-D1-R5-LED. After a predetermined time period, the voltage level at the upper end of capacitor C11 exceeds the trigger voltage of Zener diode ZD1, so Zener diode ZD1 becomes conductive, and a simulated leakage current flows through resistor R2 and leakage current detection ring ZCT1 to generate a simulated leakage current signal. The leakage current detection chip U1 detects this simulated leakage current signal and outputs a high voltage level at its pin 5, which triggers switching semiconductor device Q4 to be conductive. As a result, capacitor C11 is discharged rapidly, Zener diode ZD1 is off, and pin 5 of leakage current detection chip U1 now outputs a low voltage level. This process occurs in a very short time period; by appropriately setting the capacitance of capacitor C8, switching semiconductor device Q3 does not become conductive during this process. On the other hand, if the leakage current signal processing module 41' malfunctions so pin 5 of leakage current detection chip U1 does not output the high voltage level, then Zener diode ZD1 remains conductive, and the current through resistor R8 continuously charges capacitor C8. The voltage across capacitor C8 continuously increases, eventually triggering switching semiconductor device Q3 to conduct. This generates a simulated harmful arc signal, causing pin 1 of arc detection chip IC1 to output a high voltage level to trigger switching semiconductor devices Q1 and/or Q2 to conduct. As a result, a large current to flow through the solenoid SOL, driving the reset switch RESET of the switch module to disconnect the electrical connection between the input and output ends.

In another aspect, additional embodiments of the present invention provide an electrical power connection device, which includes a body and an electrical fault detection and interruption device according to any one of the above embodiments disposed inside the body.

In a third aspect, additional embodiments of the present invention provide an electrical appliance, which includes an electrical load, and an electrical power connection device coupled between a power supply and the load to supply power to the load, where the electrical power connection device employs an electrical fault detection and interruption device according to any one of the above embodiments.

While the present invention is described above using specific examples, these examples are only illustrative and do not limit the scope of the invention. It will be apparent to those skilled in the art that various modifications, additions and deletions can be made to the electrical fault detection and interruption device of the present invention without departing from the spirit or scope of the invention.

The invention claimed is:

1. An electrical fault detection and interruption device, comprising:
   a plurality of current carrying lines having an input end and an output end;
   a switch module, coupled on the current carrying lines between the input end and the output end, configured to connect or disconnect an electrical connection between the input end and the output end;
   a GFCI (ground fault circuit interrupter) fault detection module, configured to generate a ground fault signal in response to a leakage current on the current carrying lines;
   an AFCI (arc fault circuit interrupter) fault detection module, configured to generate an arc fault signal in response to harmful arcs on the current carrying lines;
   a drive module, configured to, in response to the ground fault signal and/or the arc fault signal, drive the switch module to disconnect the electrical connection between the input end and the output end;
   a fault signal transfer module, configured to generate a first simulated leakage current signal in response to the arc fault signal; and
   a monitoring module, configured to generate a harmful arc signal, to test whether the electrical fault detection and interruption device is functioning normally.

2. The electrical fault detection and interruption device of claim 1, wherein the GFCI fault detection module includes:
   a leakage current signal processing module, configured to detect the leakage current on the current carrying lines, and to generate the ground fault signal in response to the leakage current exceeding a predetermined threshold; and
   a self-test module, configured to periodically generate a second simulated leakage current, to test whether the leakage current signal processing module is functioning normally.

3. The electrical fault detection and interruption device of claim 1, wherein the AFCI fault detection module includes:
   an arc signal processing module, configured to detect arc signals on the current carrying line, and to generate the arc fault signal in response to detecting harmful arcs on the current carrying line; and
   a window gate module, coupled to the arc signal processing module, configured to cooperate with the arc signal processing module to determine whether harmful arcs are present on the current carrying line.

4. The electrical fault detection and interruption device of claim 3, wherein the window gate module is configured to output a window gate signal, and the arc signal processing module is configured to detect arc signals on the current carrying line based on the window gate signal.

5. The electrical fault detection and interruption device of claim 1, further comprising:
an alarm module, configured to generate a corresponding alarm signal in response to the ground fault signal and/or the arc fault signal.

6. The electrical fault detection and interruption device of claim 5, further comprising:
an auxiliary switch, configured to clear the alarm signal of the alarm module when the switch module is reset.

7. The electrical fault detection and interruption device of claim 1,
wherein the monitoring module is configured to generate the simulated harmful arc signal to detect whether the arc signal processing module is functioning normally; and
wherein the fault signal transfer module is configured to, in response to the arc fault signal, generate a simulated leakage current to detect whether the leakage current signal processing module is functioning normally.

8. An electrical power connection device, comprising:
a body; and
an electrical fault detection and interruption device of claim 1, disposed inside the body.

9. An electrical appliance, comprising:
an electrical load; and
an electrical power connection device coupled between a power supply and the electrical load, configured to supply power to the electrical load, wherein the electrical power connection device includes an electrical fault detection and interruption device of claim 1.

10. An electrical fault detection and interruption device, comprising:
a plurality of current carrying lines having an input end and an output end;
a switch module, coupled on the current carrying lines between the input end and the output end, configured to connect or disconnect an electrical connection between the input end and the output end;
a GFCI (ground fault circuit interrupter) fault detection module, configured to generate a ground fault signal in response to a leakage current on the current carrying lines;
an AFCI (arc fault circuit interrupter) fault detection module, configured to generate an arc fault signal in response to harmful arcs on the current carrying lines;
a drive module, configured to, in response to the ground fault signal and/or the arc fault signal, drive the switch module to disconnect the electrical connection between the input end and the output end;
a fault signal transfer module, configured to generate a simulated harmful arc signal in response to the ground fault signal; and
a monitoring module, configured to generate a first simulated leakage current signal, to test whether the electrical fault detection and interruption device is functioning normally.

11. The electrical fault detection and interruption device of claim 10, wherein the GFCI fault detection module includes:
a leakage current signal processing module, configured to detect the leakage current on the current carrying lines, and to generate the ground fault signal in response to the leakage current exceeding a predetermined threshold; and
a self-test module, configured to periodically generate a second simulated leakage current, to test whether the leakage current signal processing module is functioning normally.

12. The electrical fault detection and interruption device of claim 10, wherein the AFCI fault detection module includes:
an arc signal processing module, configured to detect arc signals on the current carrying line, and to generate the arc fault signal in response to detecting harmful arcs on the current carrying line; and
a window gate module, coupled to the arc signal processing module, configured to cooperate with the arc signal processing module to determine whether harmful arcs are present on the current carrying line.

13. The electrical fault detection and interruption device of claim 12, wherein the window gate module is configured to output a window gate signal, and the arc signal processing module is configured to detect arc signals on the current carrying line based on the window gate signal.

14. The electrical fault detection and interruption device of claim 10, further comprising:
an alarm module, configured to generate a corresponding alarm signal in response to the ground fault signal and/or the arc fault signal.

15. The electrical fault detection and interruption device of claim 14, further comprising:
an auxiliary switch, configured to clear the alarm signal of the alarm module when the switch module is reset.

16. The electrical fault detection and interruption device of claim 10,
wherein the monitoring module is configured to generate the first simulated leakage current to detect whether the leakage current signal processing module is functioning normally; and
wherein the fault signal transfer module is configured to, in response to the ground fault signal, generate a simulated harmful arc signal to detect whether the arc signal processing module is functioning normally.

17. An electrical power connection device, comprising:
a body; and
an electrical fault detection and interruption device of claim 10, disposed inside the body.

18. An electrical appliance, comprising:
an electrical load; and
an electrical power connection device coupled between a power supply and the electrical load, configured to supply power to the electrical load, wherein the electrical power connection device includes an electrical fault detection and interruption device of claim 10.

* * * * *